United States Patent [19]

Iyer et al.

[11] Patent Number: 4,713,605
[45] Date of Patent: Dec. 15, 1987

[54] LINEAR FEEDBACK SHIFT REGISTER FOR CIRCUIT DESIGN TECHNOLOGY VALIDATION

[75] Inventors: Venkatraman Iyer, Sunnyvale; Gil S. Lee, San Jose, both of Calif.

[73] Assignee: Advanced Micro Devices, Inc., Sunnyvale, Calif.

[21] Appl. No.: 611,450

[22] Filed: May 17, 1984

[51] Int. Cl.$^4$ ........................ G01R 31/28; G06F 11/00
[52] U.S. Cl. .................................... 324/73 R; 371/25
[58] Field of Search ........................ 324/73 R, 73 AT; 371/26, 29, 25

[56] References Cited

U.S. PATENT DOCUMENTS 3,976,864 8/1976 Gordon et al. ........................ 371/26

OTHER PUBLICATIONS

Neil et al.; "Designing a ... "; Electronics; Mar. 1, 1979; pp. 122-128.
Smith, J. E.; "Measures of the Effectiveness of Fault Signature Analysis"; IEEE Trans. on Computers; vol. C-29, No. 6; Jun. 1980; pp. 510-514.
Patel, A. M.; "A Multi-Channel CRC Register"; Proceedings of the Spring Joint Computer Conference, 1971; pp. 11-14.

Primary Examiner—Ernest F. Karlsen
Attorney, Agent, or Firm—Patrick T. King; Kenneth B. Salomon; J. Vincent Tortolano

[57] ABSTRACT

An apparatus and process employing an integrated circuit device technology within a linear feedback shift register using a cyclic redundancy check code scheme for validating the device technology under realistic very large scale integrated circuit operating conditions. By deploying two feedback shift registers in a full-duplex mode, the device technology can be subjected to arbitrarily-long, pseudo-random test signal sequences. Also, by checking the registers with variable-phase pulses, representative device delay time information can be obtained.

7 Claims, 2 Drawing Figures

U.S. Patent  Dec. 15, 1987  Sheet 1 of 1  4,713,605
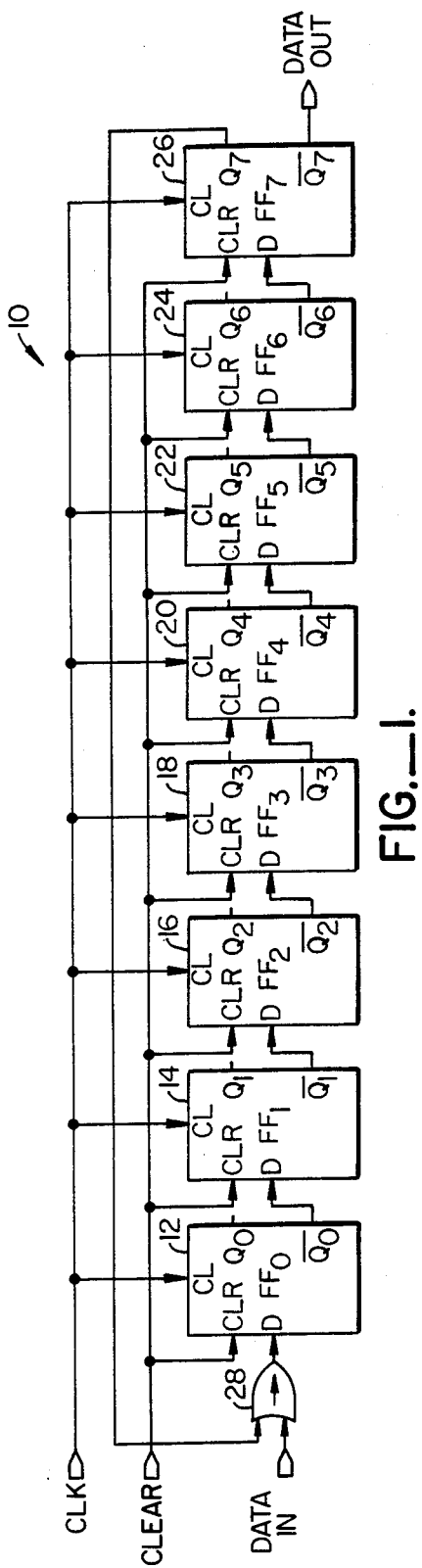
FIG._1.
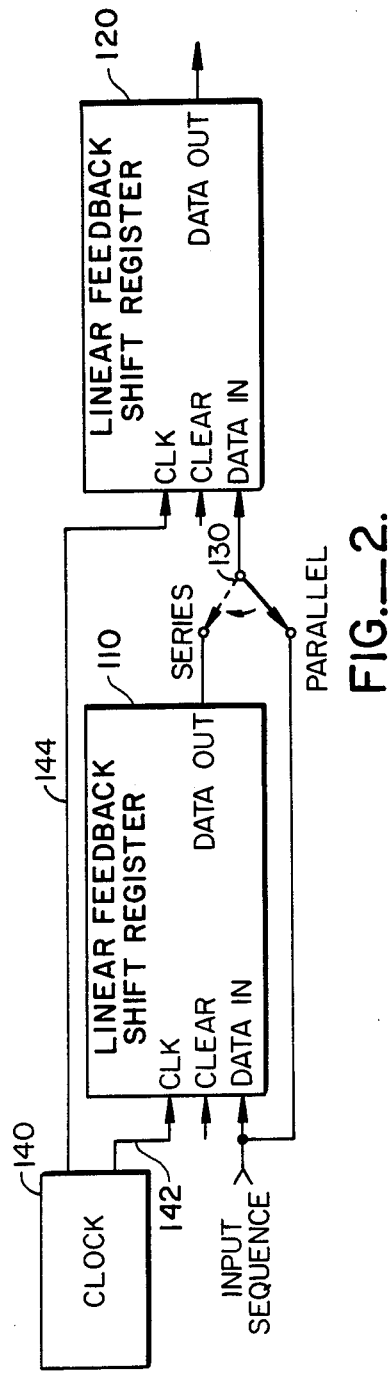
FIG._2.

LINEAR FEEDBACK SHIFT REGISTER FOR CIRCUIT DESIGN TECHNOLOGY VALIDATION

This invention relates generally to a linear feedback shift register employing prototype digital design technology to be validated under realistic very large scale integrated circuit operating conditions and, more particularly, to linear feedback shift registers employing cyclic redundancy check code generator polynomials operated in full-duplex-mode providing realistically lengthy, non-recurrent, pseudo-random signals during the circuit validation.

BACKGROUND OF THE INVENTION

The design and manufacture of very large scale integrated (VLSI) digital circuits involves the steps of digital circuit design, choice of device technology, process technology, device technology performance performance verification, and incorporation of the technology into VLSI products. The verification step consists of applying a sequence of known digital signals, representative of the signals which the device must process in practice, and monitoring the resulting output of the new circuit technology being tested. Optimally, these signals should be sequences at least as random, i.e., non-recurrent, as would be consistent with signals applied in practice, and of length sufficient to permit a number of different sequences so as to drive the circuit into a large enough number of states so that a good level of confidence in the circuit performance can be obtained.

Other features which are desirable in generating such circuit test signals are reproducibility and high frequency of the signal sequences, simplicity of the signal generating circuitry, and low-power requirements of the signal-generating circuitry.

To try to meet all these disparate requirements and accomplish the verification with a test circuitry prototype having as small a number of stages as is consistent with a reasonable assurance of reliable circuit verification, present methods employ the use of the device technology in ring oscillators, divide-by-n counters and non-feedback shift registers. While marginally adequate for low- and medium-scale integrated circuit testing, these generating circuits produce signal sequences which are very regular, i.e. recurrent, and not representative of sequences present in VLSI circuits. Furthermore, their non-recurrent sequence length is limited by the number of stages employed within the chosen test circuitry. The circuit parameters obtained by such testing tend to be optimistic compared to that realized by the device when employed on a chip under actual operating circuit conditions.

SUMMARY OF THE INVENTION

The present invention provides test circuitry exposing the chosen device technology to test sequence signals with a sufficiently high pseudo-randomness, as measured by accepted mathematical analyses, to realistically simulate VLSI circuit operating conditions so that a high level of confidence in the device technology performance is obtained. Furthermore, the length of test sequences generated is not limited by the internal structure of the test circuitry nor is it limited by a need to temporarily store the sequence in a register while a desired portion of the sequence is being generated. Hence, each circuit element within the circuit being tested can be subjected to quasi-random inputs and produce an output pattern, in addition to being in the neighborhood of other circuit elements operating under various conditions of fan-in, fan-out and timing. Thus both permanent and intermittent errors are more likely to appear and be detected.

According to the present invention, the pseudo-randomness is internally derived by the employment of a standard cyclic redundancy check code (CRC) scheme employed in conjunction with a linear feedback shift register circuit. By deploying two feedback shift registers in a full-duplex-mode generator, the restriction on length of the input sequence due to the external storage requirements usually imposed by such schemes, is eliminated. Also, by using different clock phases for the two registers, representative delay time information can be readily obtained.

An eight-bit shift register employed with a standard LRC-8 generating polynomial provides a high confidence level of circuit reliability. The circuit can generate very high frequency test sequences because the shift register is constructed from fast-acting flip-flops and gates. Reproducibility is readily obtained by resetting the feedback shift register contents to a given initial state.

BRIEF DESCRIPTION OF THE DRAWINGS

FIG. 1 illustrates one implementation of the linear feedback shift register employed in practicing the instant invention.

FIG. 2 illustrates an embodiment of the instant invention utilizing two linear feedback shift registers.

DESCRIPTION OF AN ILLUSTRATIVE EMBODIMENT

The device design technology validation technique of the present invention consists of a shift register with linear feedback provided through "exclusive OR" (XOR) gates. The number of stages of the register, the location and interconnection of the feedback elements, and the initialization pattern may vary from implementation to implementation while still providing the various benefits of the invention.

FIG. 1 illustrates one such implementation of a test sequence generator constructed in accordance with the teachings of the present invention. The generator comprises an eight-stage shift register 10 which includes eight delay (D) flip-flops 12, 14, 16, 18, 20, 22, 24 and 26 connected in serial fashion; the $\overline{Q}$ output of each flip-flop is connected to the input of the next higher-numbered flip-flop. The $Q_7$ output of flip-flop 26 is connected through a first input of an exclusive-OR (XOR) gate 28 to the input of flip-flop 12, providing the linear feedback of the output of the register 10 to the input.

The device technology to be tested is employed within one or more of the flip-flop(s) 12 through 26 and/or XOR gate(s) 28 used within register 10. By utilizing the subject device technology within all such circuit elements, any error(s) resulting from the subject device will be replicated throughout the register, improving the likelihood of detection.

Register 10 receives a serial input data signal sequence of a DATA_IN input terminal. This input sequence is conducted therefrom to a second input of the XOR gate 28. The output generated at output $\overline{Q}_7$ of flip-flop 26 is conducted to a DATA_OUT output terminal of register 10. A CLEAR input terminal of shift register 10 is connected to a clear input of each D-flip-flop 12, 14, 16, 18, 20, 22, 24 and 26 whereby the contents of shift register 10 can be initialized to zeroes at all Q outputs of the D-flip-flops by the application of a HIGH signal to the CLEAR input.

Register 10 operates synchronously under the control of a clock which is connected to a CLK input terminal of register 10. The clock pulse is conducted therefrom to a CL input of each of the D-flip-flops. Each flip-flop samples the signal applied at its input at the time a clock pulse is received and will output this signal at its Q output, following reception of the next clock pulse (the complement of this signal will be output at its $\overline{Q}$ output). In this way, a sequence of data signals will be generated at the $\overline{Q}_7$ output D-flip-flop 26 and conducted to the DATA_OUT terminal of the shift register 10.

The eight-stage register 10 implements an 8-bit cyclic redundancy check code (CRC-8) and has a 100.00% chance of detecting error bursts of 8 bits in length. The particular feedback path shown in FIG. 1, from D-flip-flop 26 to D-flip-flop 12, causes shift register 10 to generate a particular one of the CRC-8 codes known as LRC-8. LRC-8 corresponds to the remainder after multiplying the input data sequence by $x^8$ and then dividing the resulting polynomial by $(x^8+1)$. (See, e.g., *Digital, Analog, and Data Communication*, by William Sinneman, Reston Publishing Company, Reston, Va. 1982, ISBN 0-8359-1301-5, at pp. 362-367.)

As mentioned above, the particular generator polynomial implemented by the shift register 10, here $1(x^8+1)$, may vary from implementation to implementation. However, the use of one of the standard CRC generator polynomials affords the known assurance of reliability tabulated in many sources for the various standard CRC generator polynomials.

The remainder following the division by the generator polynomial is appended to the end of the input data sequence to form a data packet which is transmitted to a receiver consisting of a second linear feedback shift register, identical, with the feedback shift register 10.

A typical mode of operation according to the present invention is to clear the register 10 by applying a HIGH signal at the CLEAR terminal. Following this initialization, a sequence of input data is applied to the DATA_IN terminal of register 10, each bit received synchronously with the arrival of the clock pulse of the CLK terminal of register 10. The clock pulse also causes the contents of the D-flip-flops 12 through 24 to be shifted up to the next higher-numbered flip-flop and the $Q_7$ output of D-flip-flop 26 is XORed with the bit received from the input data sequence and conducted to the input of the lowest-order D-flip-flop 12. After the last bit of the input sequence has been clocked into register 10, the contents of the register 10, i.e. the bit values of the $\overline{Q}$ outputs of flip-flops 12 through 26 can be output via the $\overline{Q}_7$ output of D-flip-flop 26 to the DATA_OUT terminal of register 10 during the next eight clock cycles. The resulting eight bits of output sequence bears the following relationship to the input sequence, in the case of the register 10 of FIG. 1:

$$\text{output sequence} = \text{remainder}\left(\frac{(\text{input sequence}) \cdot x^8}{x^8 + 1}\right)$$

Owing to a property of cyclic redundancy check codes, a data sequence packet consisting of any original input sequence followed by the 8-bit output sequence it generated, when reapplied to the register 10, reinitialized to the same state, will produce a fixed 8-bit remainder output sequence irrespective of the original input sequence.

To exploit this property, the input sequence could be stored in an external shift register and once the output remainder has been calculated and appended to the input, the entire packet recirculated through the reinitialized feedback shift register. This method is not well-suited to an application where a prototype register is to be constructed using an experimental device technology because such an external register is costly and not relevant to the test procedure, since it must not be constructed from the experimental device technology.

In a preferred embodiment of the present invention, as will be described with reference to FIG. 2, a pair of linear feedback shift registers, 110 and 120, each identical in construction with that of register 10 (FIG. 1), is employed.

The DATA_IN terminal of shift register 120 can be connected to either the DATA_OUT terminal of shift register 110, to afford series operation of the two registers, or the DATA_IN terminals of both registers are connected together to afford parallel operation of the registers. A switch 130, with a first pole connected to the DATA_OUT terminal of shift register 110 and a second pole connected to the DATA_IN terminal of shift register 110 and a movable arm connected to the DATA_IN terminal of shift register 120, permits selection of the series or parallel operation of the registers.

A synchronizing clock 140 is provided to generate cyclic clock pulses at two outputs conducted to the CLK input terminal of shift registers 110 and 120 via signal lines 142 and 144, respectively. The clock pulse frequency and phase is identical at each output during the circuit design validation procedure to be described immediately below.

In accordance with the above procedure, switch 130 may be placed in the parallel position and a HIGH signal applied to the CLEAR terminals of shift registers 110 and 120 to initialize their contents. An input data sequence of any length is then applied to the DATA_IN terminals of shift registers 110 and 120. Following this sequence, the switch 130 is placed into the series position and the 8-bit remainder which is the contents of shift register 110 is applied to the DATA_IN terminal of register 120 and is clocked through the register during the next eight clock cycles. The resulting 8-bit contents of shift register 120 will be the fixed 8-bit remainder mentioned above.

Any malfunctions within the registers, resulting from defects within the device technology being tested, will be readily apparent, since the 8-bit remainder contained within shift register 120 will be different from this fixed constant remainder. By permitting input data sequences of any length, not being limited by the need to temporarily store the input as heretofore, a large number of test sequences may be utilized exercising the registers, and therefore the device technology being tested, into a large number of states whereby malfunctions are more likely to be discovered. The pseudo-randomness of the test sequence generated also exposes the device technology to a more realistic environment than the regular, short-cyclic patterns used heretofore. Finally, the presence of the device technology within each flip-flop and/or gate results in a high reliability of circuit design validation, since any error caused by a flip-flop or gate will be present in all the flip-flops and gates, increasing the likelihood of error detection.

Propagation delay produced in the device technology being tested by the circuitry of FIG. 2 can be measured by operating the synchronizing clock 140 so that the clock pulse frequency generated at each output is identical but the outputs have a variable phase difference.

By operating the two registers 110 and 120 in the series mode, the clock phase input to register 120 via line 144 can be advanced with respect to the clock input to register 110 via line 142. The point of advance at which a malfunction is first detected by virtue of the remainder differing from the constant, is indicative of the device propagation delay. This follows from the fact that prior to the malfunction, the correct signal was present at the DATA_OUT terminal of register 110 permitting its being properly clocked into the DATA_IN terminal of register 120, even as the clock applied to register 120 was advanced. The malfunction, which presumably resulted from an incorrect (former) signal still being present at the DATA_OUT terminal of register 110, when the advanced clock pulse arrived at register 120, is a measure of the device propagation time delay.

We claim:

1. Digital integrated circuit device technology validation circuitry comprising:
 (a) first plural stage linear feedback shift register means connected to and responsive to a source of serial input data signals, at least one of said stages including said prototype device technology to be validated, for producing serial output data signals;
 (b) second linear feedback shift register means responsive to serial input data signals for generating a plurality of internal states; and
 (c) switch means connected to an output of said first linear feedback shift register means to said source of serial data, and to an input to said second linear feedback shift register means, for selecting the input to said second shift register means, and
 (d) clock means connected to said first and second shift register means for providing synchronous operation of said shift register means, whereby certain of the internal states of said second linear feedback shift register means correspond to a malfunction of said device technology in response to test signals applied to said first linear feedback shift register means by said source of serial input data signals, said resulting output communicated via said switch means to said second linear feedback shift register means following the application thereto of said test signals via said switch means.

2. Validation circuitry according to claim 1 wherein said first and second linear feedback shift register means each include a first plurality of delay-type flip-flops (D-flip-flops) forming a plural-stage register portion of said linear feedback shift register and a second plurality of exclusive-OR (XOR) gates forming a linear feedback path portion of said linear feedback shift register means and wherein said linear feedback path portion realizes a standard cyclic redundancy check code generator polynomial.

3. Validation circuitry according to claim 2 wherein said register portion of said linear feedback shift register means comprises eight of said D-flip-flops, said linear feedback path portion comprises one said XOR gate having an output connected to the input of the lowest-order D-flip-flop of said eight and receiving at a first input said serial input data and at a second input the output of the highest-order D-flip-flop of said eight, whereby said feedback path realizes the said standard cyclic redundancy check code generator polynomial ($x^8+1$).

4. A method of validating prototype digital integrated circuit device technology employing first plural-stage linear feedback shift register means responsive to a source of serial input data signals at least one of said stages including said prototype device technology to be validated, for producing serial output data signals and employing second linear feedback shift register means responsive to serial input data signals for generating a plurality of internal states; comprising the steps:
 (a) initializing said first and second linear feedback shift registers;
 (b) applying a sequence of serial input data test signals to said first linear feedback shift register means and to said second linear feedback shift register means,
 (c) applying the output of said first linear feedback shift register means, resulting from the input of a sequence of serial input data zero signals, to the input of said seocnd linear feedback shift register means; and
 (d) observing the internal state of said second linear feedback shift register means as indicative of a malfunctioning of said device technology in response to said sequence of test signals.

5. The device technology validation method according to claim 4 wherein said first and second linear feedback shift register means each include a first plurality of delay-type flip-flops (D-flip-flops) forming register portions of said linear feedback shift register means and a second plurality of exclusive-OR (XOR) gates forming linear feedback path portions of said linear feedback shift register means and wherein said linear feedback path portion realizes a standard cyclic redundancy check code generator polynomial.

6. The device technology validation method according to claim 5 wherein said register portions of said first and second linear feedback shift register means comprises eight of said D-flip-flops, said linear feedback portions comprises one said XOR gate having an output connected to the input of the lowest-order D-flip-flop of said eight and receiving at a first input said serial input data signals and at a second input the output of the highest-order D-flip-flop of said eight, whereby said feedback path realizes the said standard cyclic redundancy check code generator polynomial ($x^8+1$).

7. The device technology validation method according to claim 4, wherein said first and second linear feedback shift register means are each further responsive to synchronizing clock pulses and wherein step (c) further calls for applying said output of said first linear feedback shift register means synchronized by said clock pulses in phase advanced from the application of said sequences of zero signals to said first linear feedback shift register means, and wherein step (d) further calls for observing said malfunction as indicated by the internal state of said second linear feedback shift register means when said phase advance is increased thereby measuring signal propagation delay within said first linear feedback shift register means.

* * * * *